United States Patent
Schell et al.

(10) Patent No.: US 8,283,576 B2
(45) Date of Patent: Oct. 9, 2012

(54) HINGES FOR CONTROL BOX ENCLOSURE

(75) Inventors: Michael Schell, Dillenburg (DE); Tobias Becker, Ehringshausen (DE); Igor Harry Schaaf, Rheinmünster (DE)

(73) Assignee: Rittal GmbH & Co. KG, Herborn (DE)

( * ) Notice: Subject to any disclaimer, the term of this patent is extended or adjusted under 35 U.S.C. 154(b) by 379 days.

(21) Appl. No.: 12/448,236

(22) PCT Filed: Nov. 29, 2007

(86) PCT No.: PCT/EP2007/010346
§ 371 (c)(1),
(2), (4) Date: Jun. 12, 2009

(87) PCT Pub. No.: WO2008/071308
PCT Pub. Date: Jun. 19, 2008

(65) Prior Publication Data
US 2009/0277661 A1 Nov. 12, 2009

(30) Foreign Application Priority Data
Dec. 12, 2006 (DE) .......................... 10 2006 058 780

(51) Int. Cl.
*H01R 4/00* (2006.01)
(52) U.S. Cl. ............ 174/375; 174/32; 174/50; 174/350; 174/351; 174/362; 174/366; 174/370; 174/374; 361/800; 361/727; 361/755; 361/756; 361/788; 361/796; 361/752; 361/730; 211/119.04; 312/265.2; 312/265.3; 312/326
(58) Field of Classification Search ............ 361/683, 361/727, 755, 756, 788, 730, 752, 796, 800; 174/50, 32, 350, 351, 362, 366, 370, 374, 174/375; 211/119.04; 312/265.2–265.3, 312/326
See application file for complete search history.

(56) References Cited

U.S. PATENT DOCUMENTS
3,651,540 A * 3/1972 Rana ............................... 16/251
(Continued)

FOREIGN PATENT DOCUMENTS
CH      607 598      9/1978
(Continued)

OTHER PUBLICATIONS
Co-Pending U.S. Appl. No. 12/311,963, filed Apr. 20, 2009; inventors Michael Schell et al.; title Control Box Arrangement.
(Continued)

*Primary Examiner* — Hung S Bui
*Assistant Examiner* — James Wu
(74) *Attorney, Agent, or Firm* — Marshall & Melhorn, LLC

(57) ABSTRACT

A control box arrangement including at least one control box, the inside of which is sub-divided, or can be sub-divided, into a plurality of compartments which are arranged one above the other and can be closed in a sealing manner by associated doors with a peripheral sealing arrangement acting on the inside of the doors. The doors are connected, by one of the vertical sides thereof, to a frame of the control box in question by hinges in an articulated manner, and can be closed by a closing mechanism on the opposite vertical side. A first hinge section is fixed to a vertical section of the frame by a fixing section, and the door is mounted on an articulated section of the first hinge section in an articulated manner by a second hinge section applied thereto. A variable structural division of the inside of the control box and a corresponding arrangement of the doors is enabled if, in the closed state, the fixing section is arranged inside the peripheral sealing arrangement, while the articulated section is arranged outside the sealing arrangement.

20 Claims, 9 Drawing Sheets

U.S. PATENT DOCUMENTS

| | | | |
|---|---|---|---|
| 3,710,198 A | 1/1973 | Burton | |
| 4,068,087 A * | 1/1978 | Ristig | 174/367 |
| 4,709,121 A * | 11/1987 | Shores | 174/375 |
| 5,407,263 A * | 4/1995 | Jones et al. | 312/265.1 |
| 6,283,565 B1 * | 9/2001 | Kohler et al. | 312/326 |
| 6,401,940 B1 | 6/2002 | Hartel et al. | |
| 6,615,998 B2 * | 9/2003 | Klassen et al. | 211/183 |
| 6,822,160 B2 * | 11/2004 | Schimmang | 174/382 |
| 2008/0062654 A1 * | 3/2008 | Mattlin et al. | 361/727 |
| 2008/0218042 A1 * | 9/2008 | Hartel et al. | 312/265.4 |

FOREIGN PATENT DOCUMENTS

| | | |
|---|---|---|
| DE | 40 13 379 C1 | 7/1991 |
| DE | 40 133 81 * | 7/1991 |
| DE | 41 11 402 C2 | 10/1991 |
| DE | 4210679 A1 | 10/1993 |
| DE | 195 16 708 A1 | 11/1996 |
| DE | 198 37 379 A1 | 3/2000 |
| DE | 101 47 988 A1 | 5/2003 |
| DE | 10 2004 016 888 B3 | 9/2005 |
| DE | 10 2004 054 173 A1 | 5/2006 |
| EP | 0 154 287 | 9/1985 |
| GB | 91 01 880.3 | 6/1991 |
| RU | 2203602 C2 | 5/2003 |
| WO | 2006123384 A1 | 11/2006 |

OTHER PUBLICATIONS

Co-Pending U.S. Appl. No. 12/448,240, filed Jun. 12, 2009; inventors Michael Schell et al.; title Control Box Arrangement.

Co-Pending U.S. Appl. No. 12/448,228, filed Jun. 12, 2009; inventors Michael Schell et al.; title Control Box Arrangement.

* cited by examiner

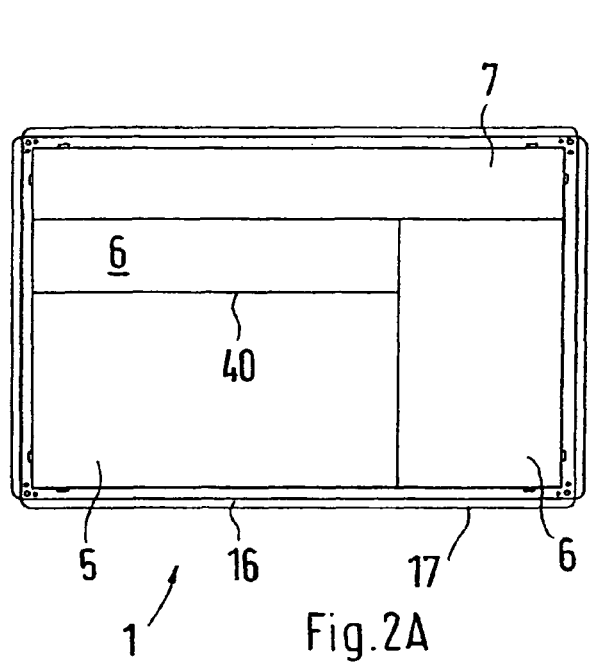
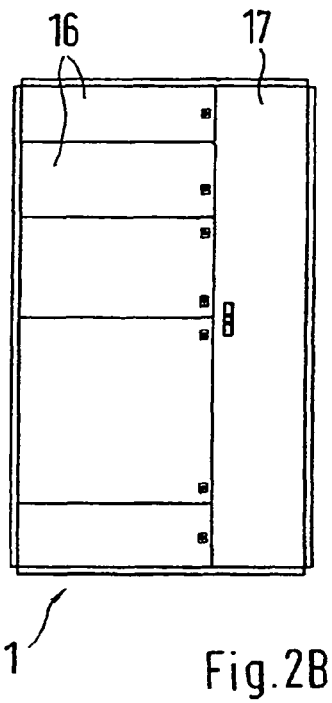
Fig.2A  Fig.2B
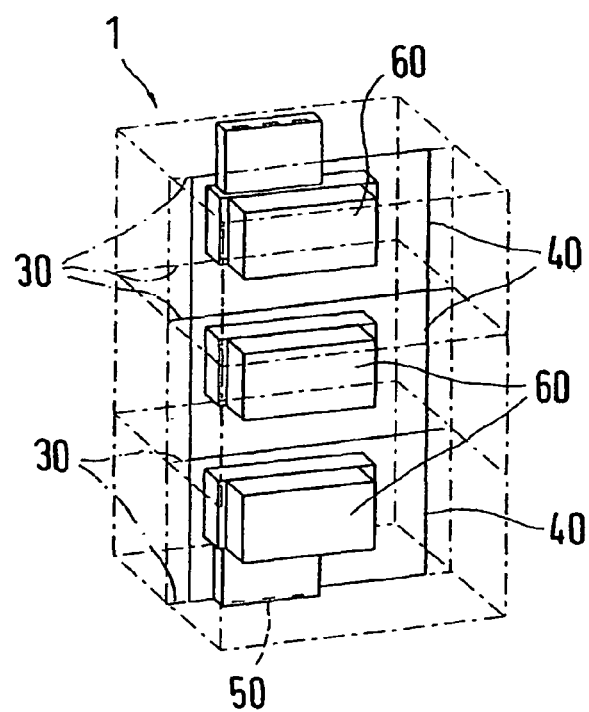
Fig.3

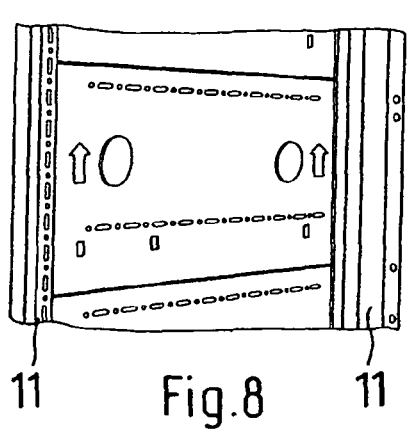
Fig.8
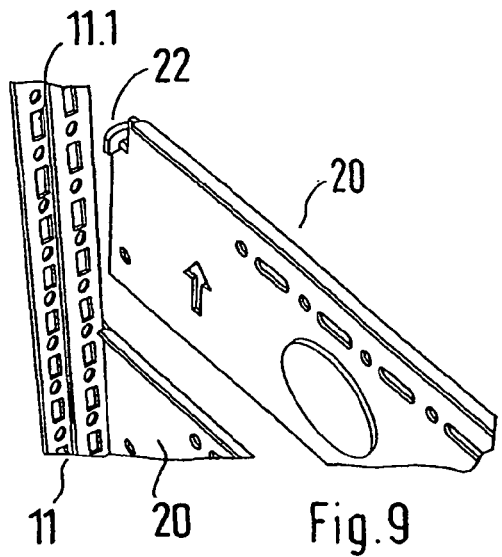
Fig.9
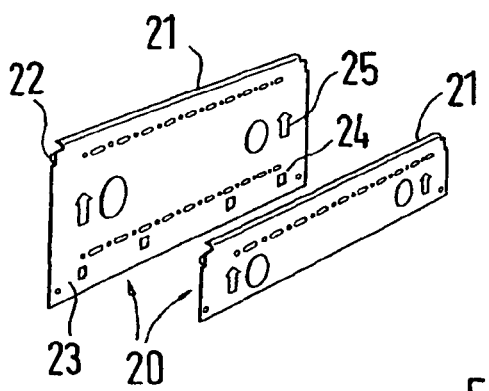
Fig.10
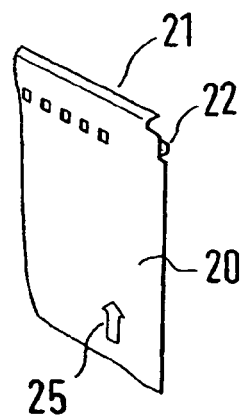
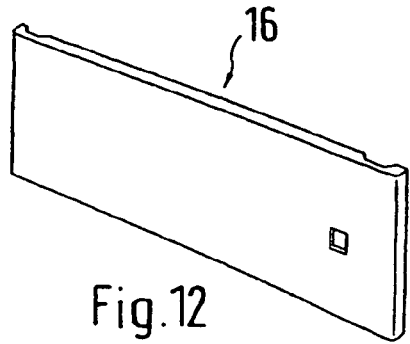
Fig.11   Fig.12

HINGES FOR CONTROL BOX ENCLOSURE

BACKGROUND OF THE INVENTION

1. Field of the Invention

This invention relates to a control box arrangement with at least one control box, having an interior that is or can be subdivided into a plurality of compartments arranged one above the other and which can be closed by associated compartment doors in a sealing manner by a peripheral sealing arrangement that performs its function in the region of the inside of these compartment doors. The compartment doors are hinge-mounted to a frame of the associated control box by hinges on their one vertical side and can be closed by a closing mechanism on their opposite vertical side. A first hinge section is fastened to a vertical section of the frame by a fastening section and the compartment door is mounted in articulating fashion on an articulating section of the first hinge section by a second hinge section attached to it.

2. Discussion of Related Art

A control box arrangement of this type is disclosed in German Patent Reference DE 41 11 402 C2. In this known control box arrangement with a control box, compartments arranged one above the other are closed at the front by compartment doors, one vertical side of which is attached in articulating fashion to a front, vertical frame leg of a frame by hinges and the other side of which can be closed by closing elements situated on a front, vertical frame leg on the opposite side. The compartment door, which has folded edges, has a peripheral seal that is spray-mounted to its inside, which cooperates in a sealing fashion with peripheral, frame-like divider strips that encompass the fronts of the compartments. The frame-mounted hinge sections are mounted in an open space provided on the outside of the associated vertical frame leg, while the associated vertical section of the peripheral seal cooperates with a divider section on the front side of the vertical frame leg, which divider section is offset inward in relation to the associated side of the cabinet. Associated mounting elements must be provided on the outside of the frame leg to permit installation of the hinge section.

German Patent Reference DE 40 13 379 C1 discloses a control box with a frame and compartments that can be closed by compartment doors and more detailed explanations are given with regard to the design of the compartments and horizontal sealing strips for the compartment doors.

German Patent Reference DE 10 2004 054 173 A1 discloses a control box arrangement in which vertical dividing walls form a plurality of compartments on the interior of the cabinet. In addition, distributing rails and main rails of a power supply system are mounted on the interior of the cabinet, thus producing a cabinet for a low-voltage system.

SUMMARY OF THE INVENTION

One object of this invention is to provide a control box arrangement that makes it easier to divide the cabinet interior into compartments in the most variable possible way.

This object is accomplished with defining characteristics described in this specification and in the claims. According to this invention, in the closed state, the fastening section is positioned inside the peripheral sealing arrangement while the articulating section is positioned outside the sealing arrangement.

These provisions enable the hinge to be fastened in a simple fashion in the inner region of the control box. In the open state, the door can be pivoted, in particular by more than 90°, out from the opening region of the compartments, in particular functional compartments with built-in device components. No special fastening elements need to be mounted on the outside of the frame.

A favorable sealing action is achieved if the sealing arrangement has a peripheral seal mounted on the inside of the compartment door that cooperates with a peripheral, frame-like arrangement of divider strips on the front surface of the associated control box. Folded edge regions are situated outside the peripheral seal and outside the second hinge section.

The hinges are fastened to the frame in a favorable fashion because the fastening section is fastened in a fastening plane oriented in the depth direction of the vertical section. An outwardly angled holding section, which extends transversely across the front surface of the vertical section, transitions into the bearing section and in the closed state, the peripheral seal extends across the holding section.

If the holding section, after extending across the front surface of the vertical section, first extends toward the rear in order to form a cavity and then bends outward again, transitioning at that point into the bearing section, this achieves a simple, uniquely defined assembly with a favorable positioning of the bearing axis, such as in an open space provided on the outside of a vertical profile. The cavity provides a uniquely defined placement and a securing lug situated in the inner region of the fastening section achieves a simple prepositioning after which the hinge section can be simply fastened by screws.

The production of a reliable seal is assisted by a hinge seal extending axially in relation to the hinge mounted in the transition region from the cavity to the bearing section and has a sealing lip extending from a seal body in an axially parallel fashion and fitting snugly against the front surface section of the vertical section.

If the vertical section is part of a vertical frame leg of the frame and has at least one row of fastening holes, whose holes are arranged in a spacing pattern, this achieves a simple possibility of variably arranging compartment doors in accordance with a possibility of variably arranging compartments, without having to provide additional fastening points, for example holes, on the outside of the frame.

In one embodiment, the peripheral seal on the inside of the compartment door and/or the hinge seal each is spray-mounted.

The sealing action is also facilitated if in the region of the vertical segment, the peripheral seal has an outward bulge in the vicinity of each of the first hinge sections, extending across the recessed region of the holding section.

A reliable sealing action is also assisted if in the region of their holding sections, the first hinge sections have recesses in relation to the horizontal sections of the frame-like arrangement of divider strips facing them so that there is no distortion of the seal along the frame-like arrangement of divider strips.

The number of separate parts is reduced and ease of assembly is further improved if a compartment door has two hinge parts that are rotated by 180° in relation to each other, one situated at the top and the other situated at the bottom.

BRIEF DESCRIPTION OF THE DRAWINGS

This invention is explained in view of exemplary embodiments shown in the drawings, wherein:

FIGS. 2A and 2B each shows a top view of a control box arrangement with a control box that has a plurality of compartments formed by vertical dividing walls and a front view of a plurality of horizontally divided compartments equipped with compartment doors;

FIG. 3 is a perspective, transparent depiction of a control box with horizontally divided compartments and a distributing rail system to which device components are connected;

FIG. 8 is a view from the inside of a side wall region of a control box, with lateral wall sections;

FIG. 9 is a perspective view of a side wall region of a control box, with a detached side wall section;

FIG. 10 is a perspective view of two side wall sections of different heights and an enlarged detail of the corner region of a side wall section;

FIG. 11 is a perspective view of a component-mounting plate;

FIG. 12 is a perspective view of a compartment door;

DETAILED DESCRIPTION OF THE INVENTION

Figure 1:
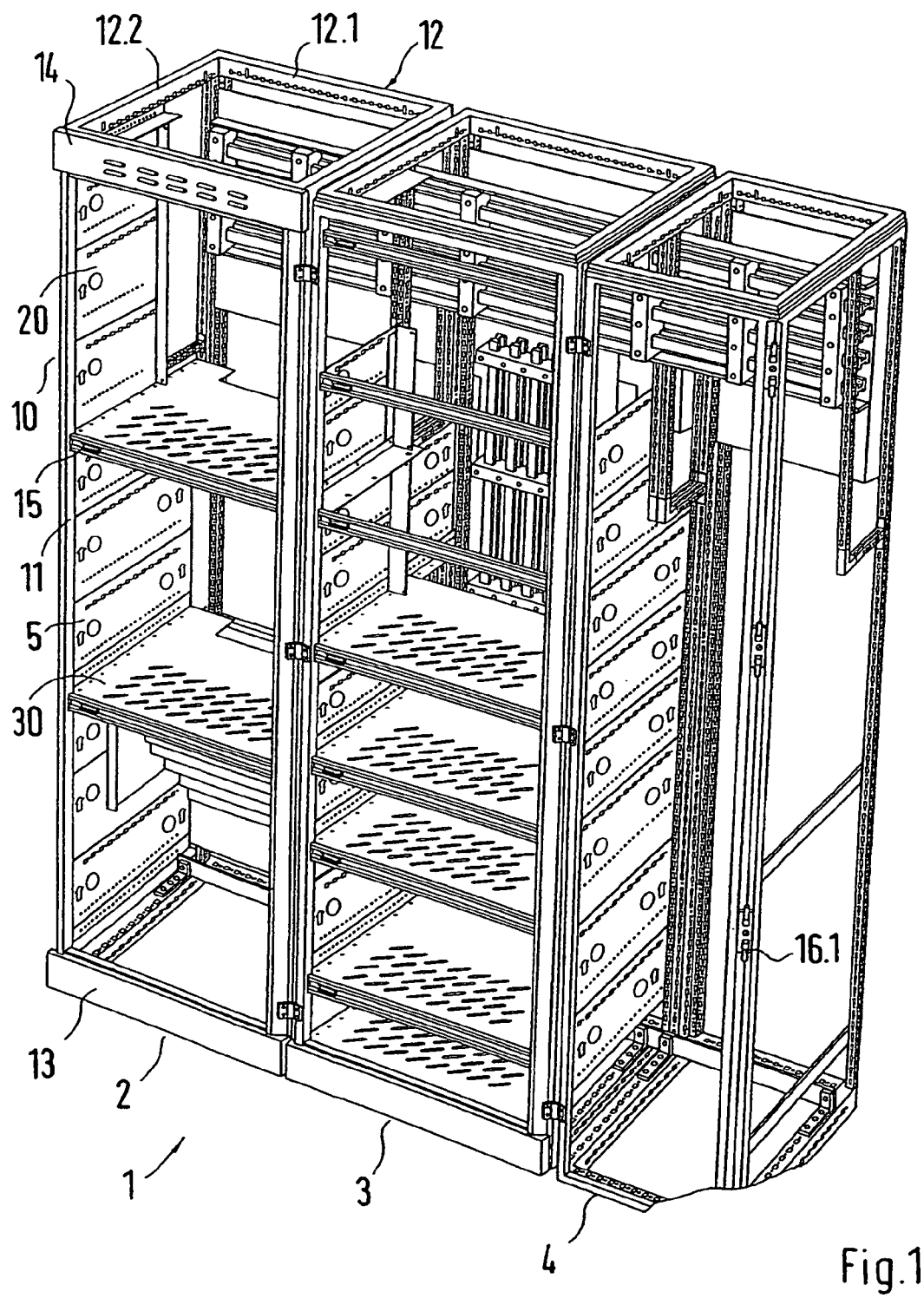
FIG. 1 is a perspective view of a control box arrangement, with the doors removed and with some of the wall elements removed, which has a plurality of functional compartments.

FIG. 1 shows a control box arrangement 1 with a plurality of control boxes 2, 3, 4 situated in a row, with their respective frames next to one another. The right control box has a narrower width than the other two control boxes 2, 3 and has only one continuous inner compartment, extending from the top to the bottom, whereas the two other control boxes 2, 3 have a plurality of horizontal compartments 5 situated one above the other, embodied in the form of functional compartments of different heights. In the rear region of the control box arrangement 1, there is a main rail system with a plurality of horizontally extending conductor rails, while in the middle control box 3, there are vertical distributing rails that are connected to the main rails by electrically conductive connecting elements with adapted current-carrying properties. The distributing rails extend vertically through a plurality of functional compartments and are mounted by corresponding bus bar holders to the front surface of back wall sections in the form of mounting plates 40 associated with the functional compartments and are accessible from the interior of the functional compartments. Appropriate device adapters for connecting device components are mounted on the distributing rails in a conductive fashion. Spaces between the device adapters are sealed by insulating covers so that they cannot be touched from the interior of the functional compartments. The distributing rails extend through a plurality of functional compartments situated one above the other and corresponding cutouts 32, which are adapted to the dimensions of the distributing rails with the covers, are provided in the rear region of horizontal compartment-dividing floors 30, and also see FIGS. 6 and 14.

FIG. 1 also shows that the control boxes 2, 3, 4 have frames 10 with four vertical frame legs 11 situated in the corner regions and have top frames with frame legs 12.1 and 12.2 extending in the width direction and the depth direction, respectively. The control boxes 2, 3, 4 also each has a respective base 13. Divider strips 15, which are U-shaped in cross section and whose open sides are oriented toward the front, are situated in the region of the front edge of the compartment-dividing floors 30. The free ends of the side legs 15.1, 15.3 are flush with the front edges of the vertical frame legs 11 and the front plane of the frame 10. An upper front panel 14 is attached to the front surface of the top frame 12. In order to close the front side of the control boxes, either a front door that extends all the way from top to bottom is provided or compartment doors 16 that are associated with the respective functional compartments and adapted to them in height, such as shown in FIG. 12, are provided, which are supported on respective hinge parts 16.1 mounted on the vertical frame legs 11 in articulating fashion by complementary hinge parts and can each be separately closed by respective associated closing parts 16.2 situated on the opposite vertical frame legs 11.

The horizontal compartments 5 situated one above the other and embodied in the form of functional compartments are delimited laterally by side wall sections 20 adapted to the height of the functional compartments and the front vertical edge regions of the side wall sections 20 are each mounted onto the associated vertical frame leg 11 while their rear vertical edge regions are each mounted either to the respective rear vertical frame legs 11 or to respective vertical mounting legs that are situated in the plane of the rear wall sections of the functional compartments. In addition to the side wall sections 20 laterally delimiting the functional compartments, the associated control boxes 2 and 4 are also closed by continuous outer side walls, and are also closed at the back and top of the control box arrangement 1.

In their upper edge region, the side walls 20 are first bent inward and upward at an obtuse angle with respect to the functional compartment and are then bent outward and upward again, parallel to the upper edge, as is also visible in FIGS. 9 and 10. A bent hook element 22 protruding outward from the plane of the side wall section 20 is situated in the upper corner region. This hook element 22 is adapted to the length of vertically oriented oblong holes in the associated vertical frame leg 11 or the mounting leg and can be hooked into it with a downward-protruding securing protrusion. Preferably, the vertical frame legs 11 have an inner lateral mounting plane bordering the front frame region of the frame 10 and, on the side oriented away from the front surface and offset laterally toward the outside, have an outer lateral mounting plane likewise oriented toward the inner side of the frame leg 11. Both the inner and outer mounting planes of the vertical frame legs 11 have rows of fastening holes. With the hook elements, the side wall sections 20 are hooked preferably into the outer, laterally recessed mounting plane. The vertical mounting leg also has a corresponding row of fastening holes in the corresponding plane. In addition to the hook elements 22, the lower, front and rear corner regions of the side wall sections 20 have fastening holes that coincide with fastening openings in the vertical frame legs 11 and the related vertical mounting legs and permit a screw connection for securing purposes. In addition, the side wall sections 20 have a horizontally extending arrangement of holes 24 in their lower edge region 23 and possibly also in their upper edge region 21 or upper section. To assure correct orientation, with the upper edge, which is bent in the above-described way, pointing toward the top, the side wall sections 20 each has orientation marks 25 in the form of arrows pointing upward. In addition, they have an opening, which is either covered by a removable plate or can be broken open along a perforation, to provide access from the side, such as into a cable space positioned next to it. The heights of the side wall sections 20 are preferably adapted to the height of a functional compartment, preferably in a certain spacing dimension, in particular in accordance with integral multiples of height units HE. Thus, side wall sections 20 of different heights can be provided in order to form functional compartments of different heights.

Accordingly, the heights of the component-mounting plates 40 and the compartment doors 16 are also adapted to the height of functional compartments in a particular spacing pattern, in particular in accordance with integral multiples of height units, thus yielding a kind of building block system for constructing desired functional compartments that can be also arranged at different heights of the control box interior in accordance with the rows of holes and their spacing patterns in the vertical frame legs 11 and vertical mounting legs.

Figure 13:
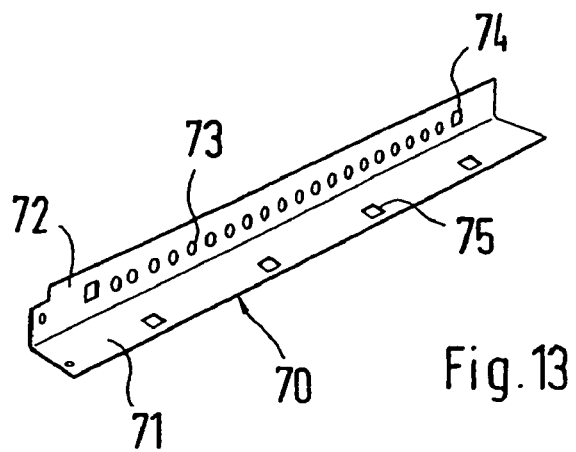
FIG. 13 is a perspective view of a mounting angle.
Figure 14:
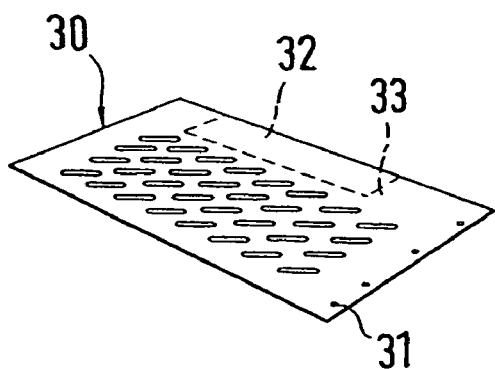
FIG. 14 is a perspective view of a compartment-dividing floor.

Mounting angles 70, which can be attached laterally to the side wall sections 20 and/or to the vertical frame legs 11 or the vertical mounting rails, are provided for arranging the compartment-dividing floors 30. These mounting angles 70 extend with a vertical leg 72 along the associated side wall section 20 and protrude with their horizontal leg 71 toward the interior of the control box. The top surfaces of two opposing horizontal legs 71 accommodate a compartment-dividing floor 30, which can be connected to them with elements, in particular screws, which engage in openings in a row of holes 73 or an arrangement of holes 31, such as shown in FIGS. 13 and 14. The horizontal legs 71 protrude beyond the inner mounting plane of the vertical frame legs 11 into the interior and the dimension of the compartment-dividing floor 30 in the width direction is at most as wide as the distance between two opposing inner mounting planes so that the compartment-dividing floor 30 can be easily inserted into the control box interior and fastened to the mounting angles 70, with the cutout 32 also properly positioned in relation to the distributing rails.

FIGS. 2A and 2B show possible ways to divide the space inside a control box, first horizontally by vertical dividing walls and then vertically by the horizontal compartment-dividing floors 30.

Figure 4:
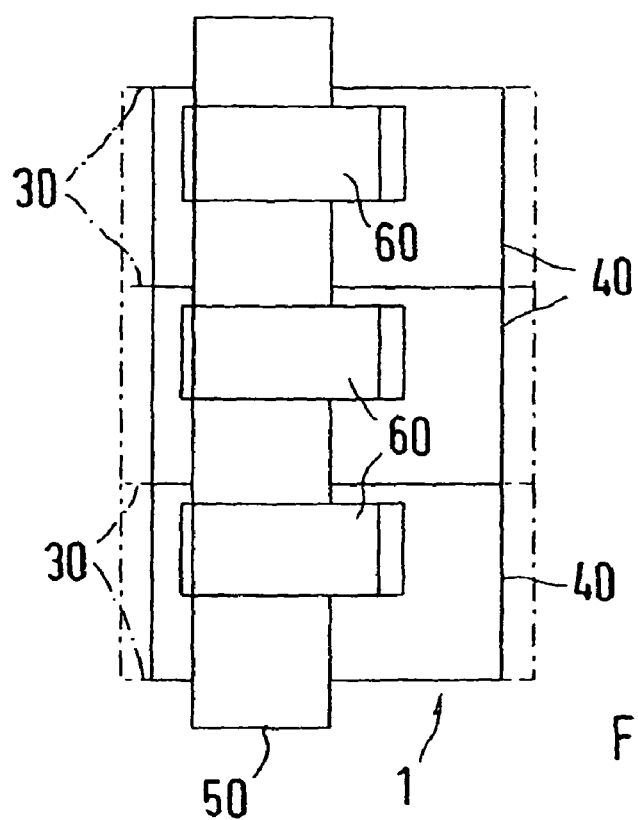
FIG. 4 is a front view of the embodiment according to FIG. 3.
Figure 5:
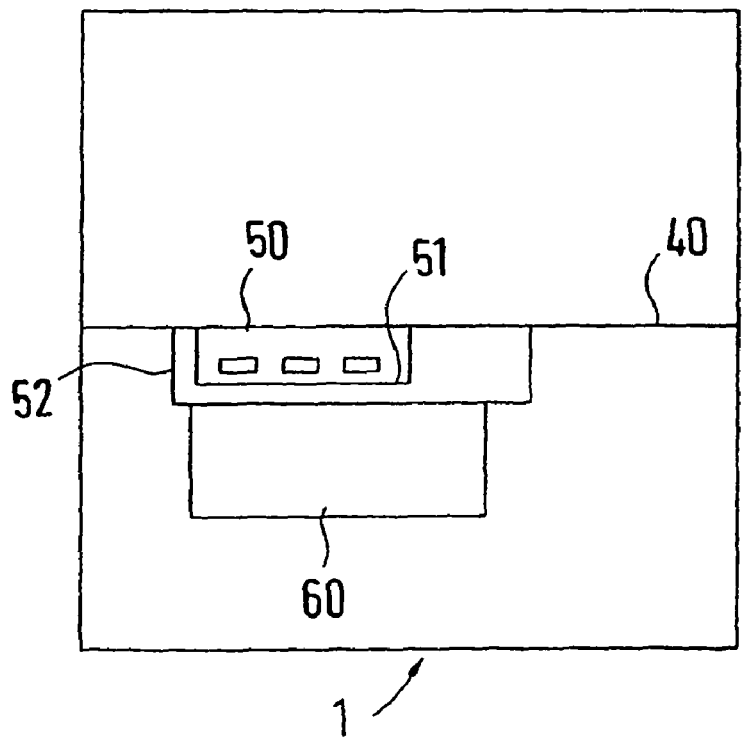
FIG. 5 is a top view of the embodiment according to FIG. 3.
Figure 6:
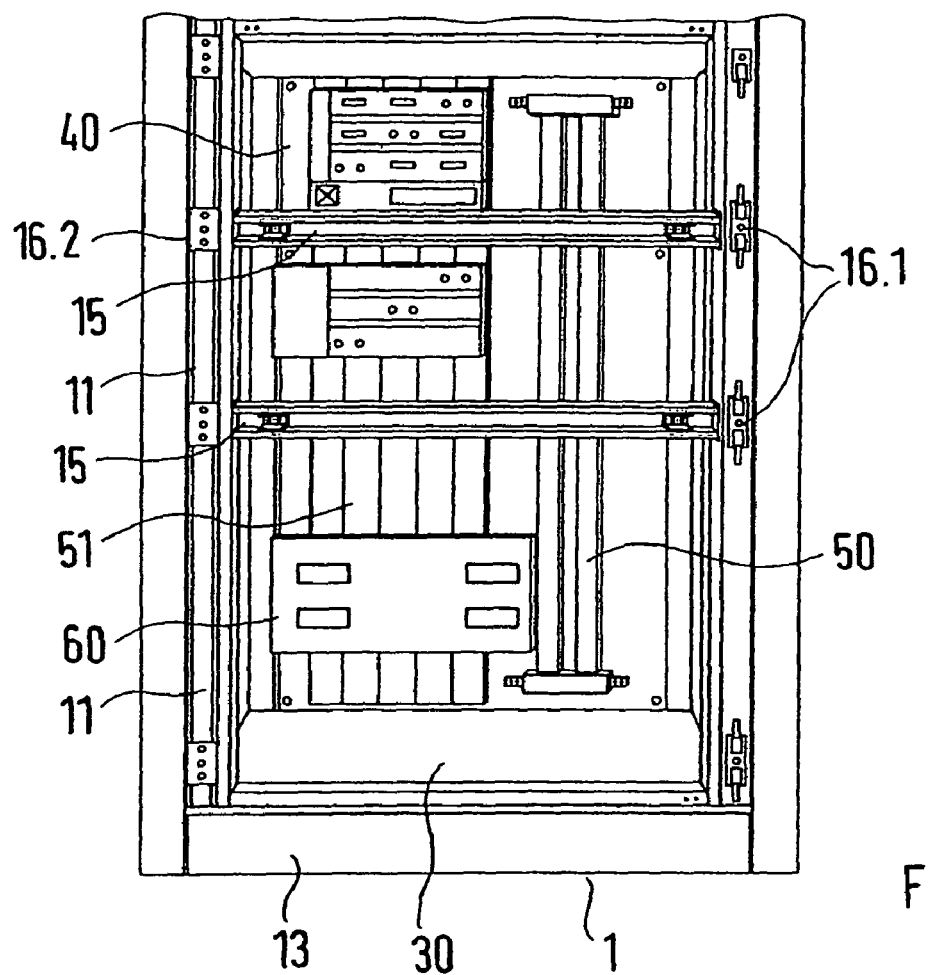
FIG. 6 is a perspective front view of a detail of a control box that has a plurality of horizontally divided functional compartments and that has a distributing rail system.
Figure 7:
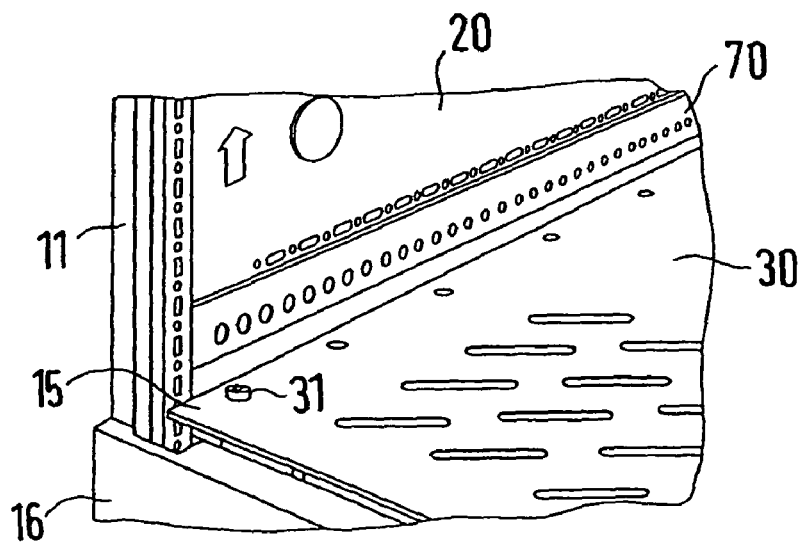
FIG. 7 is a perspective view of a detail of a control box in a corner region of a compartment that is embodied in the form of a functional compartment.

FIGS. 3, 4, and 5 show the distributing rail arrangement 50 with the bus bar cover 51 and device adapters 52 mounted on the distributing rail arrangement 50, as well as switching equipment components 60 connected to them. FIG. 6 also shows the arrangement of distributing rails 50 extending through a plurality of functional compartments and their routing through the cutouts 32 near or in the rear region of the compartment-dividing floors 30. As shown in FIG. 14, a perforation 33 can be provided in the rear edge region of the compartment-dividing floor 30, thus permitting the cutout 32 to be simply broken open when needed. The cutout 32 is open to the rear edge of the compartment-dividing floor 30 so that the compartment-dividing floor 30 can also easily be subsequently placed at any height in the control box interior and can also be removed again, without requiring removal of the arrangement of distributing rails 50.

As shown in FIG. 13, the mounting angle 70 can be hooked onto or attached to the arrangement of holes 24 in the associated side wall section by fastening holes 74, 75 and possibly by hook-shaped tabs that are bent sideways on the rear surface oriented away from the interior.

Figure 15:
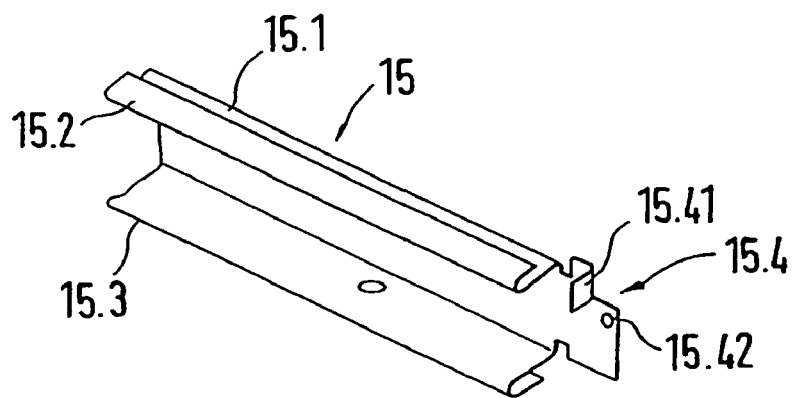
FIG. 15 is a perspective view of a section of a divider strip.

As shown in FIG. 15, the main strip piece 15.2 of each U-shaped divider strip 15 has lateral fastening sections 15.4 extending from it, at both ends, which engage behind shoulders on the rear surface of the vertical frame legs 11 in the installed position and are fastened by screws inserted through fastening openings from the rear. In addition, open regions and bent-back securing elements 15.41 can be provided in the corner region of the fastening sections 15.4.

Figure 16A:
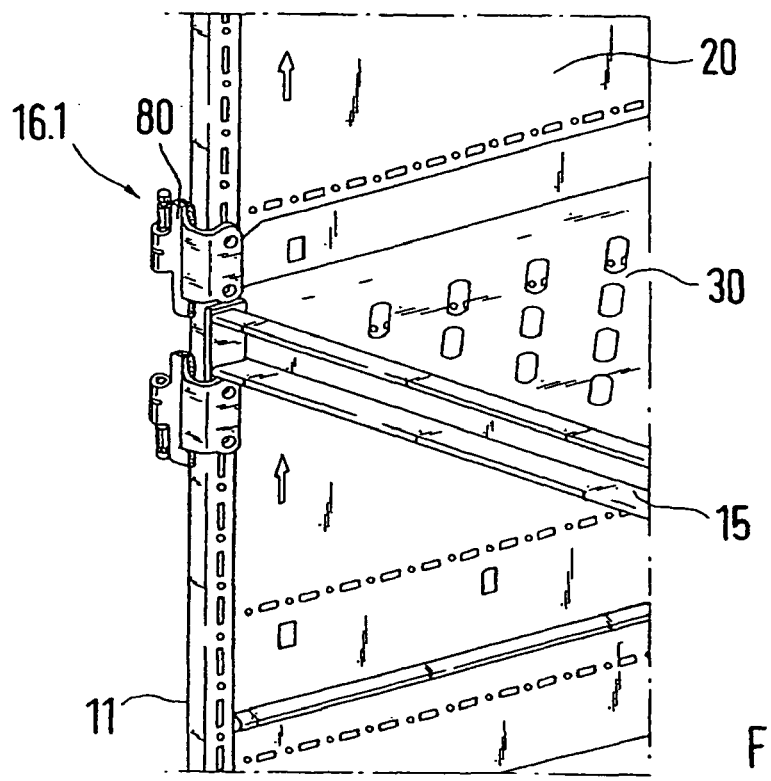
FIG. 16A is a perspective view of a detail of a control box in a transition region between two compartments, with an upper and lower hinge section for an upper and lower compartment door.
Figure 16B:
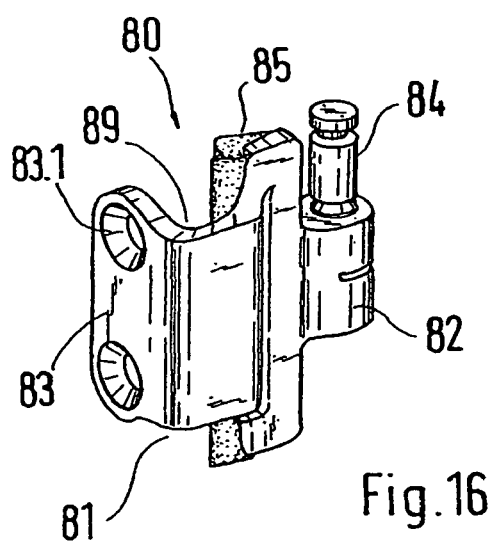
FIG. 16B is a perspective view from the outside of a detached hinge part according to FIG. 16A.

FIG. 16A is a more detailed depiction of a first hinge section 16.1 shown in FIG. 1, which is mounted on a vertical frame leg 11 and forms a hinge part 80 of a hinge for a compartment door 16. FIGS. 16B, 16C, 17, 18, 19A, and 19B show more details of the hinge and the compartment doors 16.

The hinge part 80 mounted to a vertical section of the frame 10, such as in this instance to a front vertical frame leg 11, is positioned to form a lower hinge of a compartment door 16 above the associated compartment-dividing floor 30 and above the divider strip 15, whereas another hinge part 80 forming an upper hinge of a lower compartment door is situated below the compartment-dividing floor 30 and the divider strip 15. The two hinge parts are identically embodied, but rotated by 180° with respect to each other. Each hinge part 80 is mounted to the inside of the front control box opening by a fastening section 83 and is fastened to the openings of a row of fastening openings 11.1 provided there in the vertical frame leg 11. The row of fastening openings 11.1 has fastening openings spaced apart from one another in a fixed spacing pattern. The fastening section 83 shown in greater detail in FIGS. 16B, 16C, 17, and 18 likewise has fastening openings 83.1 that correspond to the spacing pattern and allow fastening screws 88 to be screwed into place. This placement on the row of fastening openings 11.1 makes it possible to position the hinge parts 80 anywhere in the spacing pattern, such as also allowing the compartment doors 16 and compartments to be arranged in any position.

With an angled holding section 81, which extends outward across the front surface of the vertical frame leg 11, and by a section of a holding section 81, which is accordingly bent rearward as the course of the frame leg cross section continues, the fastening section 83 transitions into an outward protruding articulating section 82 on which another hinge part, which is mounted to the inside of the compartment door 16, is supported in articulating fashion by a hinge pin 84. The pin 84 has circumferential grooves with which it is secured in a pin receptacle 87 of the articulating section 82 by a snap-in spring element situated therein. In the lower hinge part 80 of a compartment door 16, the pin is oriented upward, whereas in the upper hinge part 80, it is oriented downward.

Figure 16C:
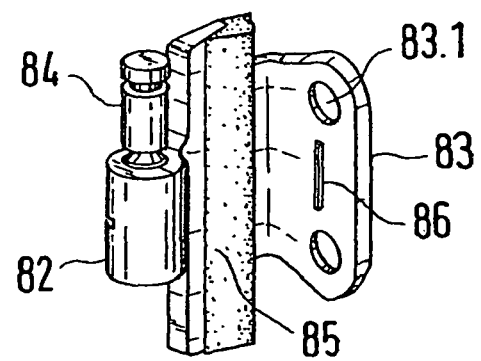
FIG. 16C shows the hinge part according to FIG. 16B, from the inside.
Figure 17:
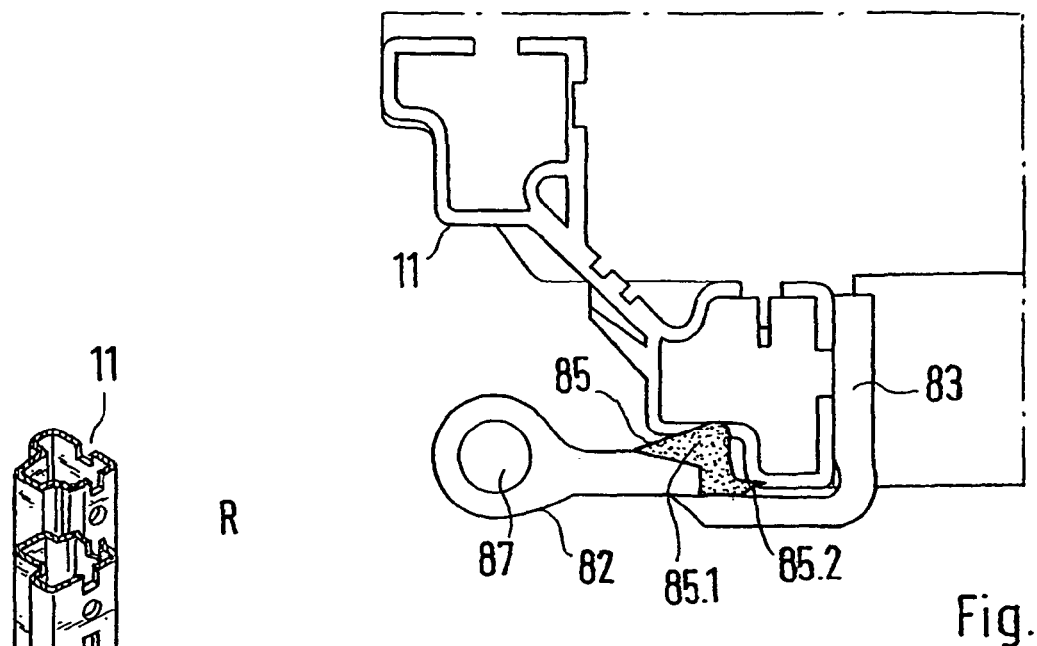
FIG. 17 shows a cross section taken through a vertical frame leg, with a hinge part mounted onto it.
Figure 18:
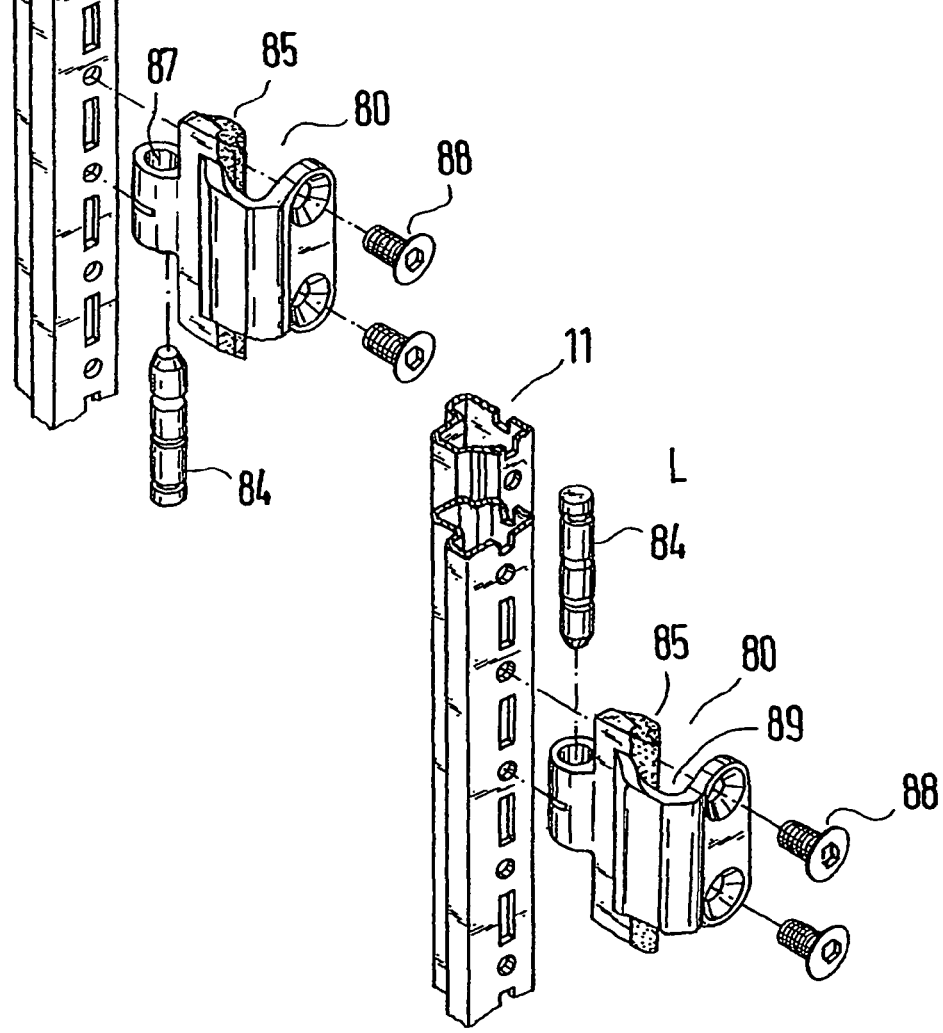
FIG. 18 shows sections of a vertical frame leg, with exploded views of an upper and lower hinge part.

By the above-described bends, the holding section 81 forms a cavity enclosing the front section of the vertical frame profile 11. As shown in FIG. 16C, a securing lug 86 is situated between the fastening holes 83.1 of the fastening section 83, which permits the hinge part 80 to be prepositioned on the vertical frame leg 11 by the cavity so that the hinge part 80 can then be easily fastened by screws. In the cavity, in its region facing the side of the control box, a hinge seal 85 is mounted, for example foamed-on, which completes the sealing of the compartment door 16. The hinge seal 85 also assists in performing the positioning function. The hinge seal 85 rests with a sealing element 85.1 against the side and front region of the vertical frame leg 11 and protrudes with a sealing lip 85.2 over the front region of the vertical frame leg 11 and extends over the entire length of the hinge in its axial direction.

Figure 19A:
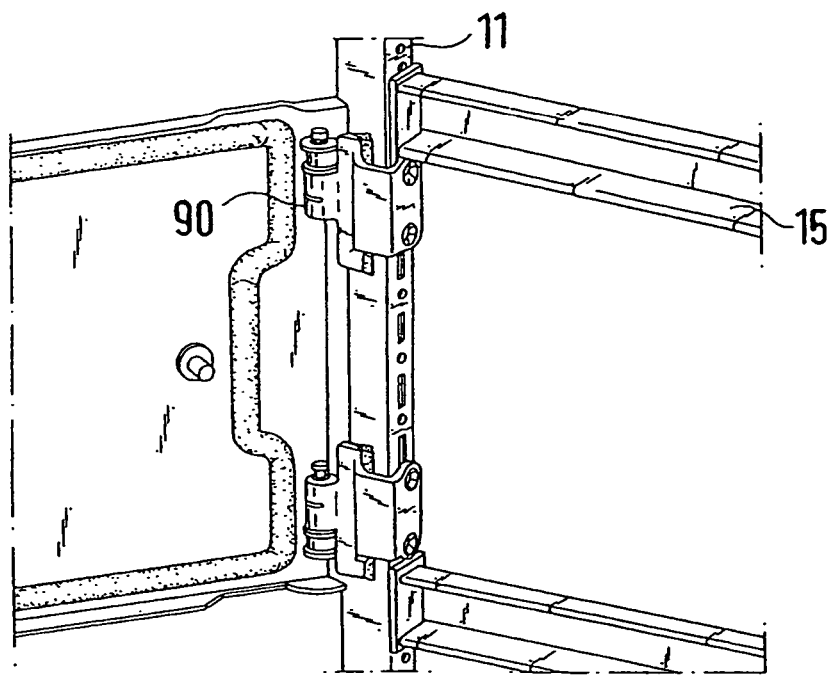
FIG. 19A is a perspective view of a detail of a control box, with a compartment and an open compartment door hinge-mounted to it.
Figure 19B:
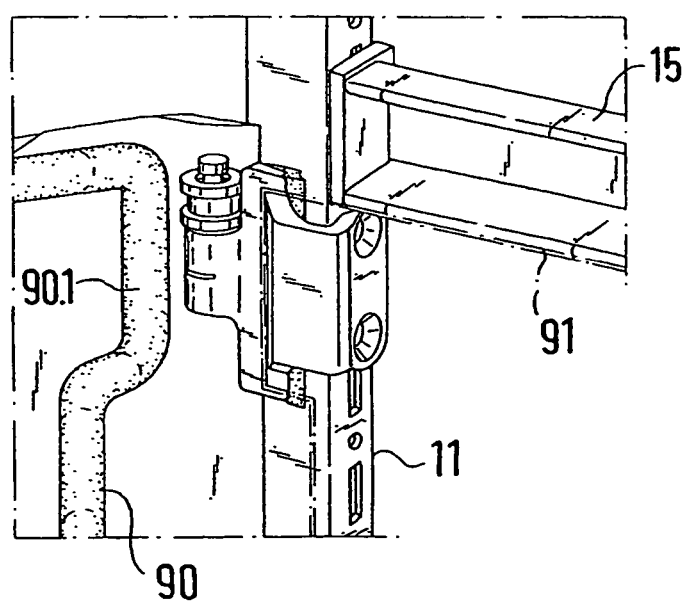
FIG. 19B shows a detail in a corner region according to FIG. 19A, with an indicated virtual position of the path of a seal when the door is in the closed position.

The holding section 81 has a recess 89 it its region oriented toward the upper or lower edge, respectively, of the compartment door, thus leaving open a definite transition between the strip sections of the divider strip 15, which form the peripheral sealing frame, and the vertical frame leg 11, and also achieving a transition into the lateral, outer section of the holding section 81, which is recessed with respect to the front surface. As shown in FIGS. 19A and 19B, the section of the peripheral seal extending across the sealing ribs of the divider strip 15 and of the vertical frame leg 11 has an outward bulge 90.1 in the region of or near each of the hinge parts 80. In this bulge, the door seal 90 extends across the recessed part of the holding section 81 and produces a continuous seal over this section, as indicated in FIG. 19B by the virtual path 91 of the door seal when the door is in the closed position.

The above-described modular design for the compartments inside the control box permits variable arrangements to be produced with simple assembly, while also satisfying the high functional reliability standards of the type required for low-voltage systems.

The invention claimed is:

1. A control box arrangement comprising at least one control box (2, 3, 4) having an interior subdivided or subdividable into a plurality of compartments (5) arranged one above the other and closable by associated compartment doors (16) in a sealing manner by a peripheral sealing arrangement (90, 85) that functions in a region of the inside of the compartment doors (16); the compartment doors (16) are hinge-mounted to a frame (10) of the associated control box (2, 3, 4) by hinges on a vertical side and are closable by a closing mechanism on an opposite vertical side; a first hinge section (16.1) is comprised of a fastening section (83) that transitions into an outwardly angled holding section (81) that in turn transitions into an articulating section (82); the first hinge section is fastened to a vertical section of the frame (10) by the fastening section (83) and the compartment door (16) is mounted in articulating fashion on the articulating section (82) of the first hinge section (16.1) by an attached second hinge section, wherein the fastening section (83) is fastened within the interior of the control box in a fastening plane oriented in a depth direction of the vertical section and by the outwardly angled holding section (81) which extends transversely across the front surface of the vertical section, and in a closed state the peripheral seal (90) extends across the holding section (81) and the fastening section (83) is situated inside the peripheral sealing arrangement (90,85) while the articulating section (82) is situated outside the sealing arrangement (90, 85).

2. The control box arrangement as recited in claim 1, wherein the sealing arrangement has a peripheral seal mounted on an inside of the compartment door (16) that cooperates with a peripheral, frame-like arrangement of divider strips on a front of the associated control box (2,3,4), with the folded edge regions being situated outside the peripheral seal and outside the second hinge section.

3. The control box arrangement as recited in claim 2, wherein the holding section (81), after extending across the front surface of the vertical section, first extends toward a rear to form a cavity and then bends outward transitioning at that point into the bearing section (82).

4. The control box arrangement as recited in claim 3, wherein a hinge seal (85) extending axially in relation to the hinge is mounted in the transition region from a cavity to the bearing section (82) and has a sealing lip (85.2) extending from a seal body (85.1) in an axially parallel fashion and fitting snugly against the front surface section of the vertical section.

5. The control box arrangement as recited in claim 4, wherein the vertical section is a part of a vertical frame leg (11) of the frame (10) and has at least one row of fastening holes (11.1) with holes arranged in a spacing pattern.

6. The control box arrangement as recited in claim 5, wherein the peripheral seal (90) on the inside of the compartment door (16) and/or the hinge seal (85) each is spray-mounted.

7. The control box arrangement as recited in claim 6, wherein near the vertical segment (91), the peripheral seal (90) has an outward bulge (90.1) near each of the first hinge sections (16.1), extending across the recessed region of the holding section (81).

8. The control box arrangement as recited in claim 7, wherein near holding sections (81) the first hinge sections (16.1) have recesses (89) with respect to the horizontal sections of the frame-like arrangement of facing divider strips forming no distortion of the seal along the frame-like arrangement of the divider strips.

9. The control box arrangement as recited in claim 8, wherein a compartment door (16) has two hinge parts (80) that are rotated by 180° with respect to each other with one situated at a top and another situated at a bottom.

10. The control box arrangement as recited in claim 1, wherein the fastening section (83) is fastened in a fastening plane oriented in a depth direction of the vertical section and by an outwardly angled holding section (81) which extends transversely across a front surface of the vertical section transitions into the articulating section (82) and in the closed state, the peripheral seal (90) extends across the holding section (81).

11. The control box arrangement as recited in claim 10, wherein the holding section (81), after extending across the front surface of the vertical section, first extends toward a rear to form a cavity and then bends outward transitioning at that point into the bearing section (82).

12. The control box arrangement as recited in claim 11, wherein a hinge seal (85) extending axially in relation to the hinge is mounted in the transition region from a cavity to the bearing section (82) and has a sealing lip (85.2) extending from a seal body (85.1) in an axially parallel fashion and fitting snugly against the front surface section of the vertical section.

13. The control box arrangement as recited in claim 1, wherein the vertical section is a part of a vertical frame leg (11) of the frame (10) and has at least one row of fastening holes (11.1) with holes arranged in a spacing pattern.

14. The control box arrangement as recited in claim 2, wherein the peripheral seal (90) on the inside of the compartment door (16) and/or the hinge seal (85) each is spray-mounted.

15. The control box arrangement as recited in claim 4, wherein near the vertical segment (91), the peripheral seal (90) has an outward bulge (90.1) near each of the first hinge sections (16.1), extending across the recessed region of the holding section (81).

16. The control box arrangement as recited in claim 2, wherein near holding sections (81) the first hinge sections (16.1) have recesses (89) with respect to the horizontal sections of the frame-like arrangement of facing divider strips forming no distortion of the seal along the frame-like arrangement of the divider strips.

17. The control box arrangement as recited in claim 1, wherein a compartment door (16) has two hinge parts (80) that are rotated by 180° with respect to each other with one situated at a top and another situated at a bottom.

18. A control box arrangement comprising:
a control box including a frame and having an interior;
a compartment door closing at least a portion of the control box in a sealing manner by a peripheral sealing arrangement in a region of the inside of the compartment doors;
a hinge mounting the compartment door to a vertical section of the frame, the hinge including a fastening section fastened to the vertical section of the frame within the interior of the control box and an articulating section on which the compartment door is mounted in articulating fashion, the hinge further including a holding section extending at an angle from the fastening section and between the fastening section and the articulating section; and
a peripheral seal extending across the holding section, wherein in a closed state the fastening section is situated inside each of the peripheral sealing arrangement of the compartment door and the peripheral seal of the holding section, and the articulating section is situated outside each of the peripheral sealing arrangement of the compartment door and the peripheral seal of the holding section.

19. The control box arrangement as recited in claim 18, wherein the fastening section is fastened to a first side of the vertical section that is in a fastening plane oriented in a depth direction of the vertical section, and the holding section is outwardly angled and extends transversely across the front surface of a second side of the vertical section.

20. The control box arrangement as recited in claim 19, wherein the peripheral seal is disposed between the holding section and the front surface of the second side of the vertical section.

* * * * *